(12) United States Patent
Maruyama

(10) Patent No.: US 8,760,889 B2
(45) Date of Patent: Jun. 24, 2014

(54) OVER-CURRENT DETECTING APPARATUS FOR SWITCHING ELEMENT

(75) Inventor: Sho Maruyama, Machida (JP)

(73) Assignee: Nissan Motor Co., Ltd., Yokohama (JP)

( * ) Notice: Subject to any disclaimer, the term of this patent is extended or adjusted under 35 U.S.C. 154(b) by 644 days.

(21) Appl. No.: 13/122,325

(22) PCT Filed: Dec. 11, 2009

(86) PCT No.: PCT/IB2009/007735
§ 371 (c)(1),
(2), (4) Date: Apr. 1, 2011

(87) PCT Pub. No.: WO2010/067193
PCT Pub. Date: Jun. 17, 2010

(65) Prior Publication Data
US 2011/0181263 A1    Jul. 28, 2011

(30) Foreign Application Priority Data
Dec. 12, 2008    (JP) .................................. 2008-316488

(51) Int. Cl.
*H02H 7/10*    (2006.01)
*H02H 5/04*    (2006.01)

(52) U.S. Cl.
USPC .......................................... 363/50; 361/93.8

(58) Field of Classification Search
CPC .................................. G05F 1/10; H03K 17/14
USPC ............. 363/50, 52, 54; 361/93.1, 93.7, 93.8, 361/124
See application file for complete search history.

(56) References Cited

U.S. PATENT DOCUMENTS

| | | | |
|---|---|---|---|
| 5,501,517 A | 3/1996 | Kiuchi | |
| 5,898,557 A * | 4/1999 | Baba et al. | 361/103 |
| 7,586,726 B2 * | 9/2009 | Maebara et al. | 361/93.8 |
| 8,254,075 B2 * | 8/2012 | Higashida et al. | 361/93.9 |
| 2007/0263334 A1 | 11/2007 | Nishida | |
| 2008/0100978 A1 | 5/2008 | Maebara et al. | |
| 2012/0293017 A1 * | 11/2012 | Lidsky et al. | 307/126 |

FOREIGN PATENT DOCUMENTS

| | | |
|---|---|---|
| JP | 56-105854 U | 8/1981 |
| JP | 06-188641 A | 7/1994 |
| JP | 08-054427 A | 2/1996 |
| JP | 10-093355 A | 4/1998 |

(Continued)

OTHER PUBLICATIONS

The extended European Search Report for the corresponding European Patent Application No. 09831537.7 dated May 7, 2012.

(Continued)

*Primary Examiner* — Matthew Nguyen
(74) *Attorney, Agent, or Firm* — Global IP Counselors, LLP

(57) ABSTRACT

An over-current detecting apparatus for a switching element includes a reference power source, a comparator circuit, a current converting element, a first resistor, and a second resistor. The comparator circuit includes a first input terminal that receives a voltage corresponding to a current flowing in the switching element and a second input terminal that receives a reference voltage supplied from the reference power source. The current converting element converts a voltage of a temperature detecting element (4) that detects a temperature of the switching element into a current corresponding to the voltage of the temperature detecting element. The first resistor is connected in series to a reference power supply side of the second input terminal of the comparator circuit. The second resistor is connected in series to a ground side of the second input terminal of the comparator circuit.

10 Claims, 4 Drawing Sheets

(56) References Cited

FOREIGN PATENT DOCUMENTS

| | | |
|---|---|---|
| JP | 2002-017036 A | 1/2002 |
| JP | 2002-026707 A | 1/2002 |
| JP | 2002-315303 A | 10/2002 |
| JP | 2004-117111 A | 4/2004 |
| JP | 2005-348517 A | 12/2005 |
| JP | 2007-241411 A | 9/2007 |
| JP | 2008-206348 A | 9/2008 |

OTHER PUBLICATIONS

An English translation of the Chinese Office Action of corresponding Chinese Application No. 200980145598.0, issued on Feb. 5, 2013.

* cited by examiner

OVER-CURRENT DETECTING APPARATUS FOR SWITCHING ELEMENT

CROSS-REFERENCE TO RELATED APPLICATIONS

This U.S. National stage application claims priority to Japanese Patent Application No. 2008-316488, filed on Dec. 12, 2008. The entire disclosure of Japanese Patent Application No. 2008-316488 is hereby incorporated herein by reference.

BACKGROUND

1. Field of the Invention

The present invention generally relates to an over-current detecting apparatus that detects an over-current abnormality in a switching element.

2. Background Information

A power MOS transistor typically has an extremely large on-resistance temperature coefficient α. It is known to provide an over-current protection circuit for an insulated-gate bipolar transistor (IGBT) to protect the IGBT of an inverter circuit from an over-current in the IGBT. It has been proposed in Japanese Laid-Open Patent Publication No. 2002-26707 to provide an over-current protection circuit that takes into account a temperature characteristic of a detection voltage to protect the IGBT of the inverter circuit from an over-current in the IGBT. In this over-current protection circuit of this publication, the detection voltage from a diode provided inside a semiconductor chip and a reference voltage are fed to an operational amplifier (op-amp). The operational amplifier then compares a difference between the detection voltage and the reference voltage to an over-current detection reference value. In this way, the degree to which the on-resistance temperature coefficient of the transistor affects an over-current detection current value is suppressed.

SUMMARY

However, with the conventional over-current protection apparatus described above, the use of the operational amplifier increases the overall cost of the over-current detecting apparatus, and requires additional space in the over-current detecting apparatus for accommodating the operational amplifier. With the illustrated embodiments, an over-current detecting apparatus is discloses that does not use an operational amplifier. Thus, in the illustrated embodiments, the overall cost of the over-current detecting apparatus can be reduced as compared to an over-current detecting apparatus that requires an operational amplifier. Moreover, in the illustrated embodiments, the over-current detecting apparatus can be more compact as compared to an over-current detecting apparatus that requires an operational amplifier.

In view of the state of the known technology, an over-current detecting apparatus is provided that does not use an operational amplifier. Basically, in the illustrated embodiments, the over-current detecting apparatus for a switching element is provided with a reference power source, a comparator circuit, a current converting element, a first resistor, and a second resistor. The comparator circuit includes a first input terminal that receives a voltage corresponding to a current flowing in the switching element and a second input terminal that receives a reference voltage supplied from the reference power source. The current converting element is connected in series between the reference power source and the second input terminal of the comparator circuit. The current converting element converts a voltage of a temperature detecting element that detects a temperature of the switching element into a current corresponding to the voltage of the temperature detecting element. The first resistor is connected in series to a reference power supply side of the second input terminal of the comparator circuit that is between the reference power supply and the second input terminal of the comparator circuit. The second resistor is connected in series to a ground side of the second input terminal of the comparator circuit that is between a ground and the second input terminal of the comparator circuit.

Thus, by supplying a reference voltage for detecting an over-current to an input terminal of the comparator circuit, this over-current detecting apparatus that does not use an operational amplifier. In particular, the reference voltage is obtained by using the current converting element to convert a voltage value of the temperature detecting element of the switching element into a current and using a resistor to convert the current into a voltage. In other words, the current converting element is used to convert a voltage value of a temperature detecting element having a temperature characteristic into a corresponding current value. The current value has a similar (same sign) temperature characteristic as a sense voltage of the switching element and the temperature characteristic of the current value can be revised to a temperature coefficient corresponding to the sense voltage by setting the values of the resistors appropriately. This revision of the temperature characteristic is accomplished using a current converting element and, thus, it is not necessary to use an operational amplifier, which is expensive and takes up space.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Figure 1:
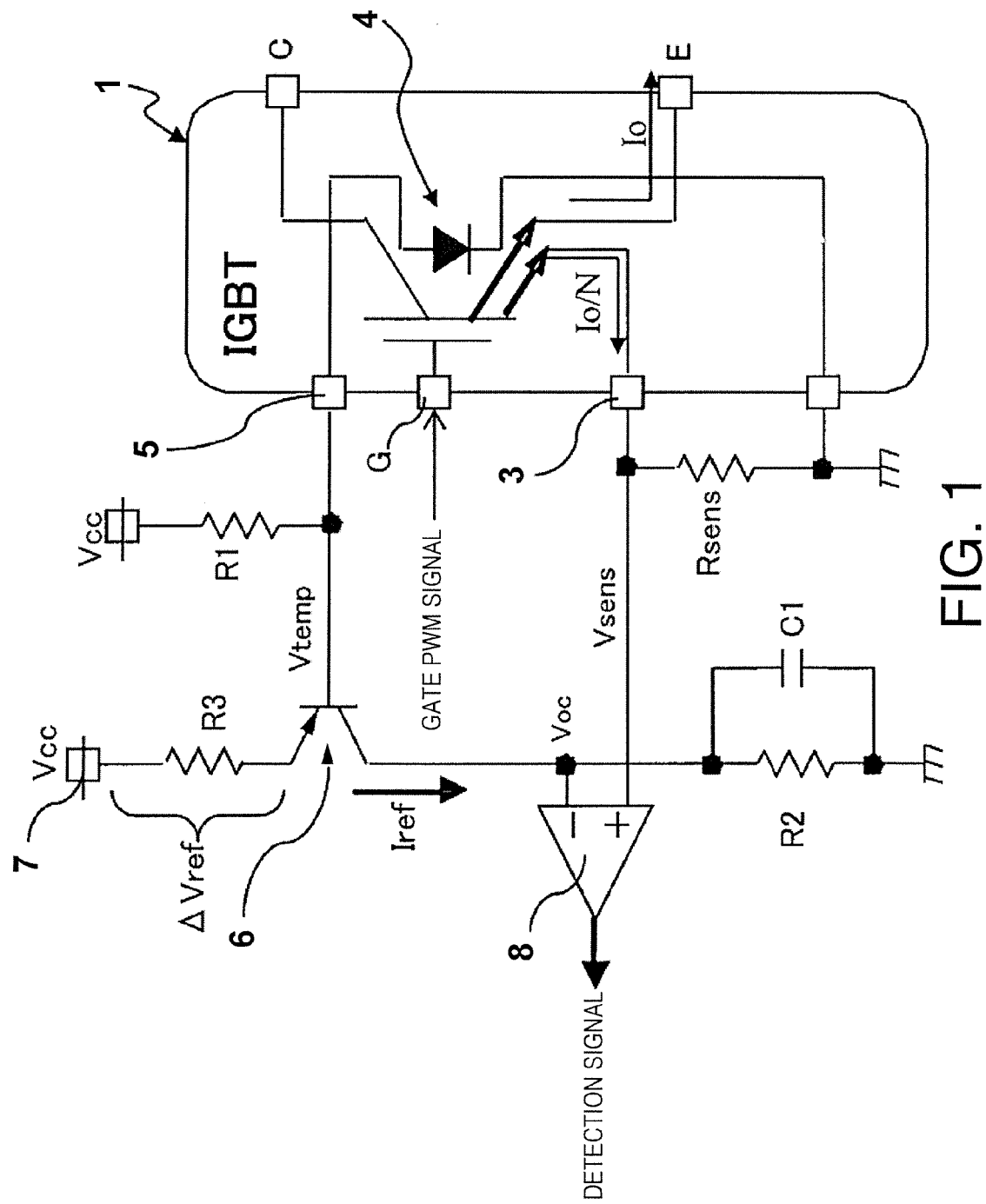
FIG. 1 is an electric circuit diagram showing an over-current detecting apparatus according to a first embodiment.

Referring initially to FIG. 1, an electric circuit diagram is illustrated with an over-current detecting apparatus in accordance with a first embodiment. This over-current detecting apparatus can be used as an apparatus for detecting an abnormality in an insulated-gate bipolar transistor (IGBT) of a switching element such as an intelligent power module. This first embodiment will exemplify such an application of the over-current detecting apparatus. However, the over-current detecting apparatus is not limited to such an application and can be applied to various types of switching elements. As explained below, the over-current detecting apparatus of this illustrated embodiment can be relatively inexpensive, relatively compact since the over-current detecting apparatus does not use an operational amplifier in detecting if an over-current condition exists.

In this embodiment, the over-current detecting apparatus serves to detect a current abnormality in a switching element 1 (e.g., an IGBT). The switching element 1 is switched by a gate PWM signal sent to a gate G of the switching element 1 from a gate drive circuit (not shown), and a collector current Io flows from a collector C to an emitter E of the switching element 1 due to an on-drive signal. In this embodiment, the switching element 1 is a transistor having a current detection terminal 3. When the collector current Io flows from the collector C to the emitter E due to an on-drive signal being sent to the gate G, a current Is flows to the current detection terminal 3. The current Is is proportional to the current Io (e.g., Is=Io/N; wherein a mask ratio N of currents Io and Is is known). The current Io/N flowing from the current detection terminal 3 is converted to a voltage, i.e., a detection voltage or sense voltage Vsens, by a current detection resistor Rsens and the detection voltage Vsens is supplied to a positive input terminal of a comparator 8.

The switching element 1 has a temperature detecting element 4 including a diode for detecting a temperature of the switching element 1. A positive terminal of the temperature detecting element 4 is connected to a voltage converting resistor R1 through a temperature detection terminal 5, and a current flowing through the connection is converted into a voltage. The converted voltage is supplied to a base of a current converting element 6. In this illustrated embodiment, the temperature detecting element 4 has a negative temperature characteristic such that the sense voltage decreases when the temperature increases.

A reference power source 7 supplying a reference voltage Vcc is connected to a negative terminal of the comparator 8 through a resistor R3 and the current converting element 6, which comprises a PNP transistor. A resistor R2 and a capacitor C1 are connected between the negative terminal of the comparator 8 and ground. The resistor R2 serves to convert a current Iref flowing from the current converting element 6 into a voltage and the capacitor C1 serves to stabilize this voltage.

The operating principles and effects of the over-current detecting apparatus according to this embodiment will now be explained. The sense voltage Vsens can be expressed according to Equation 1 below, where Io is a main current flowing in the switching element 1, Io/N is a sense current determined by a mask ratio (1:N) with respect to the main current, and Rsens is the resistance value of a resistor used to convert the sense current into the sense voltage Vsens.

$$V\text{sens}=(Io/N)\times R\text{sens} \qquad (1)$$

Figure 4:
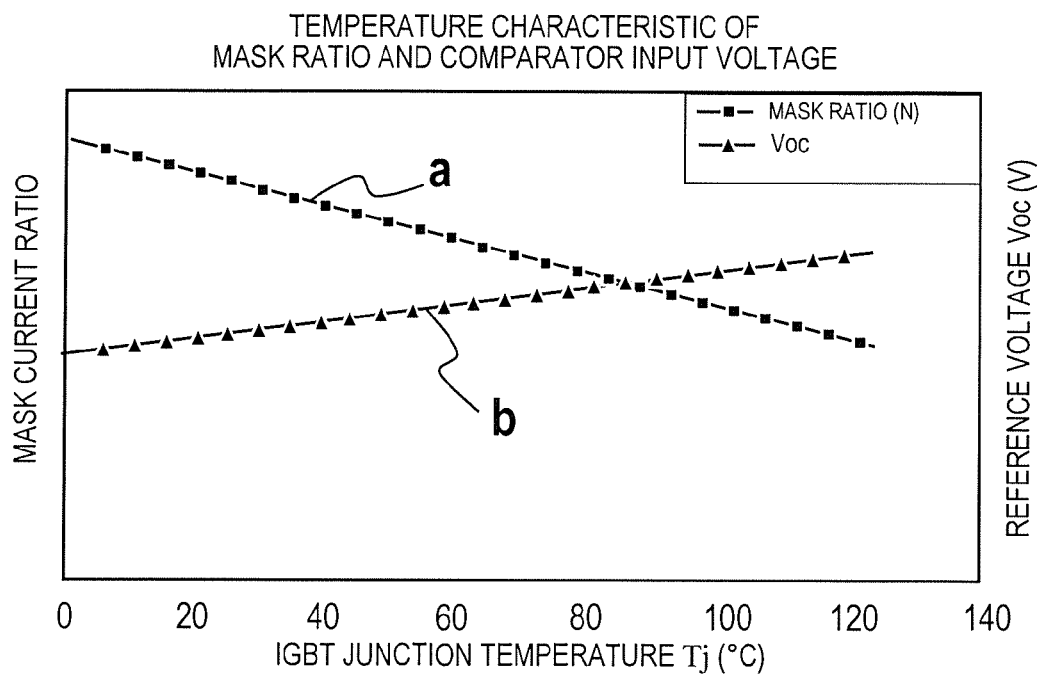
FIG. 4 is a graph showing characteristic plots of a mask ratio and a reference voltage versus a junction temperature of a switching element.
Figure 5:
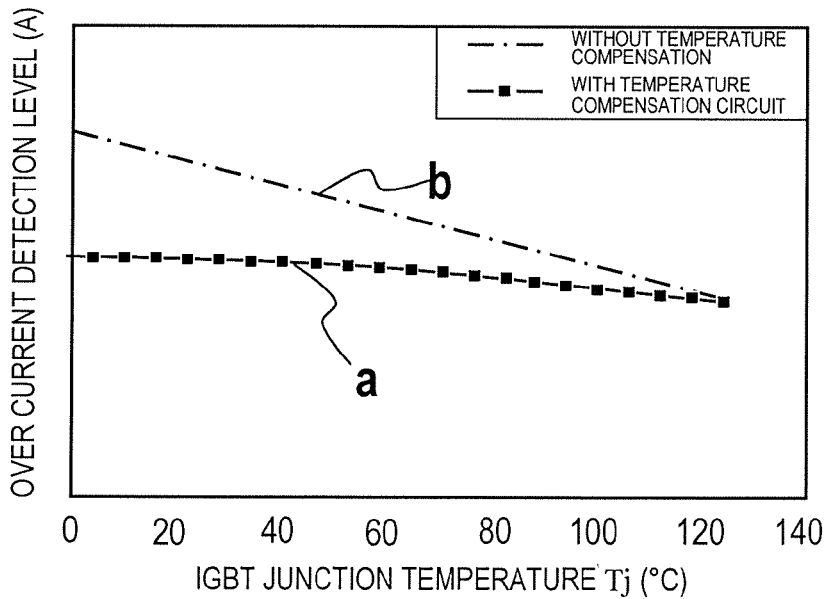
FIG. 5 is a graph showing a plot of an over-current detection level versus a junction temperature of a switching element.

According to Equation 1, when the mask ratio N has a negative temperature characteristic (i.e., when the mask ratio N decreases in response to an increase in temperature) as indicated with the curve a in FIG. 4, the sense voltage Vsens has a positive temperature characteristic (i.e., the sense voltage Vsens increases in response to an increase in temperature). That is, the sense voltage Vsens has a similar temperature characteristic to the curve b in FIG. 4.

Meanwhile, a voltage Vtemp of the temperature detecting element 4 of the switching element 1 is supplied to the base terminal of the current converting element (PNP transistor) 6 and the reference voltage Vcc is connected to an emitter terminal of the current converting element 6 through a resistor R3. In this way, the temperature detection voltage of the temperature detecting element 4 can be converted into a current. Under such conditions, the current Iref flowing in the current converting element (PNP transistor) 6 is expressed according to Equation 2 below, where Vbe is a voltage existing between the base and the emitter of the current converting element (PNP transistor).

$$I\text{ref}=(Vcc-Vbe-V\text{temp})/R3 \qquad (2)$$

By taking a derivative of the current Iref with respect to temperature T, Equation 3 shown below can be obtained. Here, it is assumed that the voltage Vbe between the base and the emitter of the current converting element (PNP transistor) 6 does not have a temperature characteristic.

$$\delta I\text{ref}/\delta T=(-\delta V\text{temp}/\delta T)/R3 \qquad (3)$$

According to Equation 3, when the temperature detection voltage from the temperature detecting element 4 has a negative temperature characteristic, the current Iref flowing through the transistor 6 has a positive temperature characteristic.

When the current Iref is converted into a voltage by the resistor R2, the input voltage Voc of the comparator 8 is expressed according to Equation 4 shown below.

$$V\text{oc}=(Vcc-Vbe-V\text{temp})\times R2/R3 \qquad (4)$$

Taking a derivative of both sides with respect to temperature results in the Equation 5 shown below.

$$\delta V\text{oc}/\delta T=(-\delta V\text{temp}/\delta T)\times R2/R3 \qquad (5)$$

Thus, with the over-current detecting apparatus according to this embodiment, the positive temperature coefficient of the input voltage Voc supplied to the comparator 8 (which has a positive temperature characteristic as shown with the curve b in FIG. 4) can be changed by adjusting a ratio of the resistance values R2 and R3. In other words, by adjusting the ratio of R2 and R3 (R2/R3) such that the slope of the temperature characteristic of the input voltage Voc is the same as the slope of the positive temperature characteristic of the sense voltage Vsens, the over-current detecting apparatus that functions independently of the temperature of the switching element 1 can be realized by providing only a current converting element (PNP transistor) as shown in FIG. 1.

The method of setting the resistance values R2 and R3 will now be explained in more detail. When the temperature characteristic of the mask ratio N is negative as indicated with the curve a in FIG. 4 (i.e., the mask ratio N decreases as the temperature increases), the ratio R2/R3 should be set to be equal to the absolute value (opposite sign) of the slope of the temperature coefficient of the mask ratio N. In this way, the positive temperature characteristic of the sense voltage Vsens can be cancelled out.

The curve a in FIG. 4 illustrates a case in which the values of the resistors R2 and R3 have been set appropriately in the over-current detecting apparatus shown in FIG. 1 such that an over-current detection level does not depend on temperature. Conversely, the curve b in FIG. 4 shows a measurement of the over-current detection level obtained with an apparatus in which the transistor 6 of the over-current detecting apparatus shown in FIG. 1 has been eliminated and the temperature detection terminal 5 is not connected to the negative input terminal of the comparator 8. As illustrated by the curve a in FIG. 4, with this embodiment, the over-current detection level is affected very little by changes in a junction temperature at a semiconductor junction portion of the switching element 1.

Second Embodiment

Figure 2:
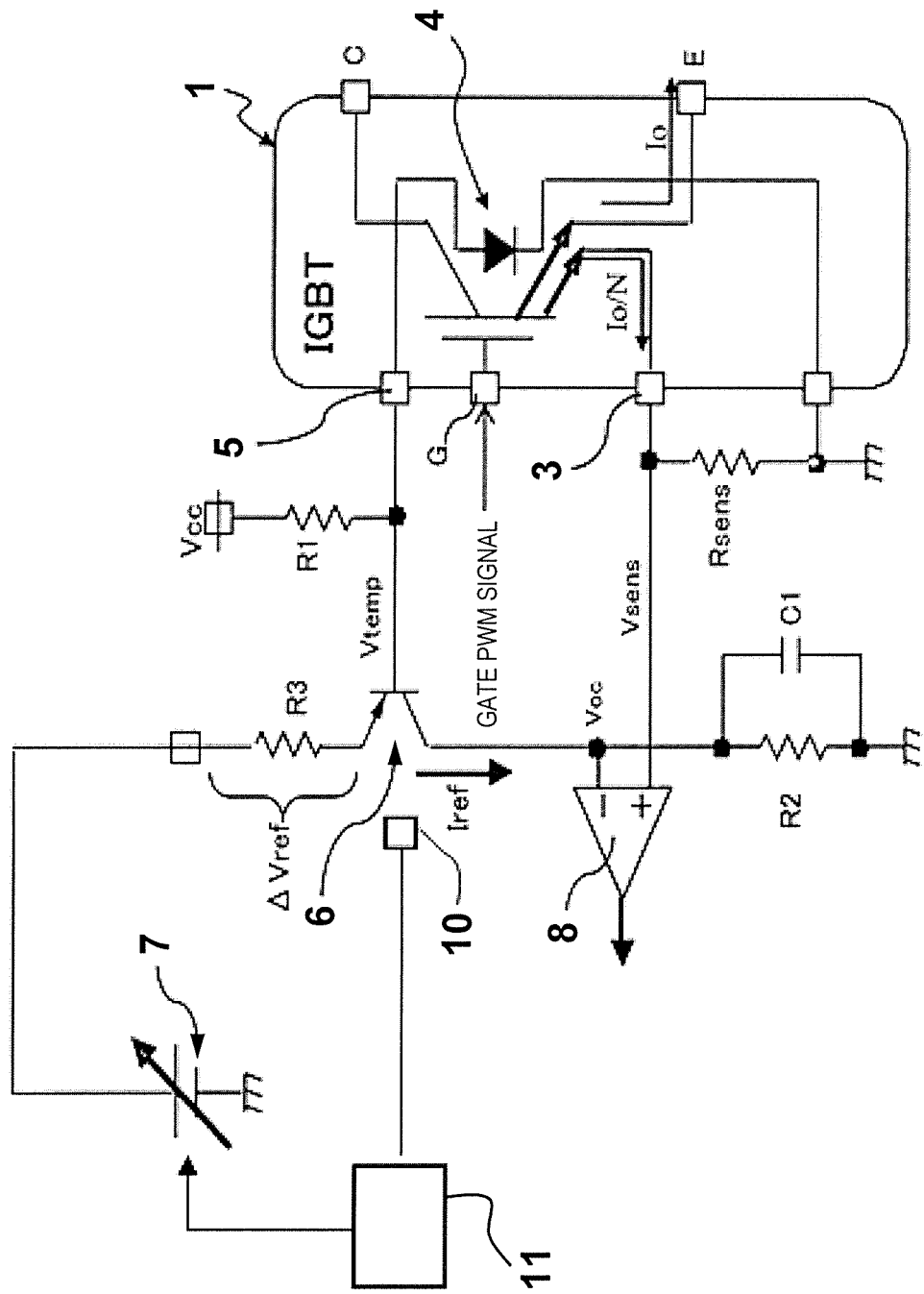
FIG. 2 is an electric circuit diagram showing an over-current detecting apparatus according to a second embodiment.

Referring now to FIG. 2, an over-current detecting apparatus in accordance with a second embodiment will now be explained. FIG. 2 is an electric circuit diagram showing the over-current detecting apparatus according to a second embodiment. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

In the first embodiment, it is assumed that the voltage Vbe between the base and the emitter of the PNP transistor constituting the current converting element 6 does not depend on temperature, and thus, the base-emitter voltage Vbe does not appear in Equation 3. However, there are times when the base-emitter voltage Vbe of the current converting element 6 changes in response to an ambient temperature other than a junction temperature Tj of the switching element 1. Therefore, in this second embodiment, a variable voltage device is used as the reference power source 7 in order to compensate for a temperature characteristic of the base-emitter voltage Vbe of the current converting element 6. Otherwise, the apparatus is substantially the same as the first embodiment and, thus, explanations of the parts are omitted here.

Examples of a temperature other than the junction temperature of the switching element 1 include a temperature of a substrate on which the current converting element 6 is mounted. In this embodiment, a temperature sensor 10 is used to detect a temperature of the substrate and a control device 11 revises the reference voltage Vcc of the reference power source 7 so as to counterbalance the effect of a change in the detected substrate temperature. More specifically, the control device 11 controls the voltage Vcc of the reference power source 7 such that the voltage Vcc decreases as the temperature detected by the sensor 10 increases. In this way, an over-current can be detected without taking into account a characteristic fluctuation resulting from a temperature change of the current converting element 6.

Third Embodiment

Figure 3:
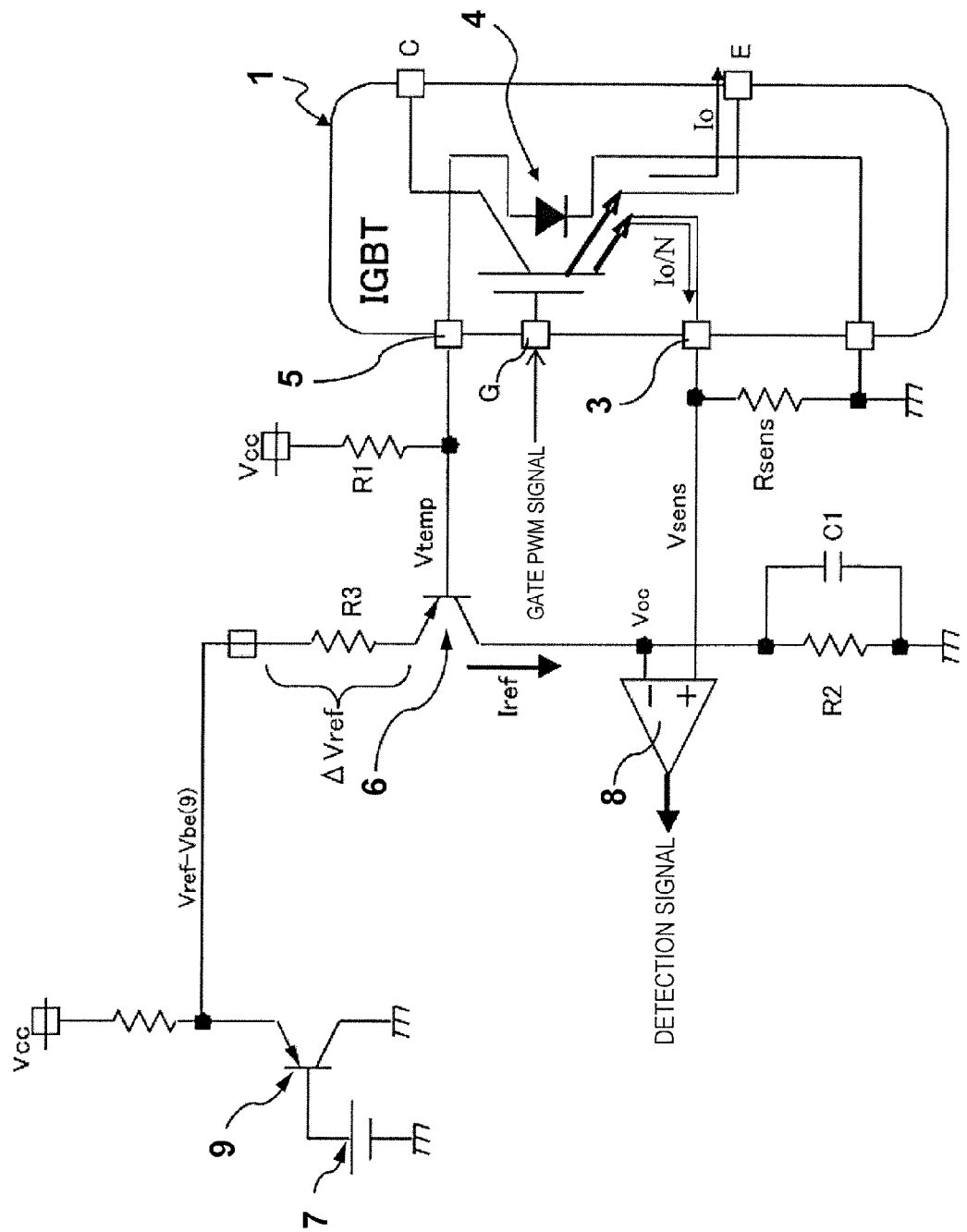
FIG. 3 is an electric circuit diagram showing an over-current detecting apparatus according to a third embodiment.

Referring now to FIG. 3, an over-current detecting apparatus in accordance with a third embodiment will now be explained. In this embodiment, a current converting element 9 including a PNP transistor that is the same as current converting element 6 is used to reduce the effect of an ambient temperature of the current converting element 6. A base terminal of the current converting element 9 is connected to the reference power source 7, which has a small degree of temperature dependence, and an emitter terminal of the current converting element 9 is connected to the reference voltage point. The current converting element 9 is mounted on the same substrate as the current converting element 6.

In this embodiment, the previous Equation 2 can be revised to the Equation 2' as shown below, where Vref is the voltage of the reference power source 7 and Vbe(9) is the voltage between the base and the emitter of the PNP transistor 9 connected to the power source 7.

$$Iref = ((Vref + Vbe(9)) - Vbe - Vtemp)/R3 \quad (2')$$

Since the PNP transistor 9 is identical to the PNP transistor constituting the current converting element 6 and is mounted on the same substrate, the base-emitter voltages Vbe(9) and Vbe are equal and the Equation 2' can be rewritten as the Equation 2" shown below.

$$Iref = (Vref - Vtemp)/R3 \quad (2'')$$

In short, the over-current detection circuit that is not affected by a temperature characteristic of the current converting element 6 can be obtained because the effect of the base-emitter current Vbe of the current converting element 6 is counterbalanced (canceled out) by providing the current converting element 9.

While only selected embodiments have been chosen to illustrate the present invention, it will be apparent to those skilled in the art from this disclosure that various changes and modifications can be made herein without departing from the scope of the invention as defined in the appended claims. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. An over-current detecting apparatus for a switching element, comprising:
    a reference power source;
    a comparator circuit including a first input terminal that receives a voltage corresponding to a current flowing in the switching element and a second input terminal that receives a reference voltage supplied from the reference power source;
    a current converting element connected in series between the reference power source and the second input terminal of the comparator circuit, with the current converting element converting a voltage of a temperature detecting element that detects a temperature of the switching element into a current corresponding to the voltage of the temperature detecting element;
    a first resistor connected in series between the reference power source and the second input terminal of the comparator circuit with the current converting element being located between the first resistor and the second input terminal of the comparator circuit; and
    a second resistor connected in series between a ground and the second input terminal of the comparator circuit.

2. The over-current detecting apparatus as recited in claim 1, wherein
    a ratio between a resistance value of the second resistor and a resistance value of the first resistor is equal to an absolute value of a slope of a temperature characteristic of a mask ratio of the switching element, the switching element having a gate, a collector, an emitter and a current detection terminal and the mask ratio being a ratio of current flowing in the emitter and in the current detection terminal, and such that a sign of the slope of the temperature characteristic of the voltage at the second input terminal of the comparator circuit is opposite to a sign of the slope of the temperature characteristic of the mask ratio of the switching element.

3. The over-current detecting apparatus as recited in claim 1, further comprising
    a voltage regulating device that regulates a voltage of the reference power source according to a temperature characteristic of the current converting element.

4. The over-current detecting apparatus as recited in claim 3, wherein
    the voltage regulating device includes a variable voltage device, a temperature detecting section that detects a temperature of the current converting element, and a control section that controls the variable voltage device based on a temperature of the current converting element detected by the temperature detecting section, with the control section further controlling the variable voltage device such that a voltage of the variable voltage device decreases in accordance with an increase of the temperature of the current converting element.

5. The over-current detecting apparatus as recited in claim 3, wherein
the current converting element includes a PNP transistor.

6. The over-current detecting apparatus as recited in claim 5, wherein
the voltage regulating device includes an additional PNP transistor that is identical to the PNP transistor of the current converting element, with the reference power source being connected to a base of the second PNP transistor and with an emitter of the PNP transistor of the current converting element being connected to an emitter of the additional PNP transistor.

7. The over-current detecting apparatus as recited in claim 2, further comprising
a voltage regulating device that regulates a voltage of the reference power source according to a temperature characteristic of the current converting element.

8. The over-current detecting apparatus as recited in claim 7, wherein
the voltage regulating device includes a variable voltage device, a temperature detecting section that detects a temperature of the current converting element, and a control section that controls the variable voltage device based on a temperature of the current converting element detected by the temperature detecting section, with the control section further controlling the variable voltage device such that a voltage of the variable voltage device decreases in accordance with an increase of the temperature of the current converting element.

9. The over-current detecting apparatus as recited in claim 7, wherein
the current converting element includes a PNP transistor.

10. The over-current detecting apparatus as recited in claim 9, wherein
the voltage regulating device includes an additional PNP transistor that is identical to the PNP transistor of the current converting element, with the reference power source being connected to a base of the second PNP transistor and with an emitter of the PNP transistor of the current converting element being connected to an emitter of the additional PNP transistor.

* * * * *